United States Patent [19]

Nakashima et al.

[11] Patent Number: 5,712,523

[45] Date of Patent: Jan. 27, 1998

[54] SURFACE ACOUSTIC WAVE DEVICE

[75] Inventors: Koji Nakashima, Ishikawa-ken; Hideya Morishita, Matto, both of Japan

[73] Assignee: Murata Manufacturing Co., Ltd., Kyoto-fu, Japan

[21] Appl. No.: 495,895

[22] Filed: Jun. 28, 1995

[30] Foreign Application Priority Data

Jan. 11, 1995 [JP] Japan .................. 7-002829

[51] Int. Cl.⁶ .................................. H01L 41/08
[52] U.S. Cl. ................ 310/313 R; 310/344; 310/346
[58] Field of Search ................. 310/313 R, 344, 310/346

[56] References Cited

U.S. PATENT DOCUMENTS

| | | | |
|---|---|---|---|
| 3,786,373 | 1/1974 | Schulz et al. | 310/313 R |
| 3,938,178 | 2/1976 | Miura et al. | 357/91 |
| 3,996,574 | 12/1976 | Bobeck et al. | 340/174 TF |
| 4,343,688 | 8/1982 | Harwood | 310/313 R |
| 4,454,442 | 6/1984 | Cullen | 310/313 R |
| 4,845,397 | 7/1989 | Herrick et al. | 310/348 |
| 5,030,875 | 7/1991 | Knecht | 310/346 |
| 5,237,235 | 8/1993 | Cho et al. | 310/313 R |
| 5,252,882 | 10/1993 | Yatsuda | 310/313 R |
| 5,281,883 | 1/1994 | Ikata et al. | 310/313 R |
| 5,323,081 | 6/1994 | Hasleberg | 310/313 R |
| 5,446,330 | 8/1995 | Eda et al. | 310/313 R |
| 5,453,652 | 9/1995 | Eda et al. | 310/313 R |
| 5,459,368 | 10/1995 | Ohnishi et al. | 310/313 R |

FOREIGN PATENT DOCUMENTS

| | | | |
|---|---|---|---|
| 0495316 | 7/1992 | European Pat. Off. | H03H 9/05 |
| 1392518 | 4/1975 | United Kingdom | H03H 9/14 |

*Primary Examiner*—Thomas M. Dougherty
*Attorney, Agent, or Firm*—Ostrolenk, Faber, Gerb & Soffen, LLP

[57] ABSTRACT

A SAW device (11) includes a SAW element (13) which is bonded onto a support substrate (12) in a face down mode through solder (19, 20), and a metal cap (21) enclosing the SAW element (13). Assuming that and $\alpha_1$, $\alpha_2$ and $\alpha_3$ represent the thermal expansion coefficients of the SAW element (13), the support substrate (12) and the conductive cap (21) along the surface wave propagation direction respectively, $\alpha_3 \leq \alpha_1$ when $\alpha_1 > \alpha_2$, and $\alpha_3 \leq \alpha_1$ when $\alpha_1 < \alpha_2$.

5 Claims, 3 Drawing Sheets

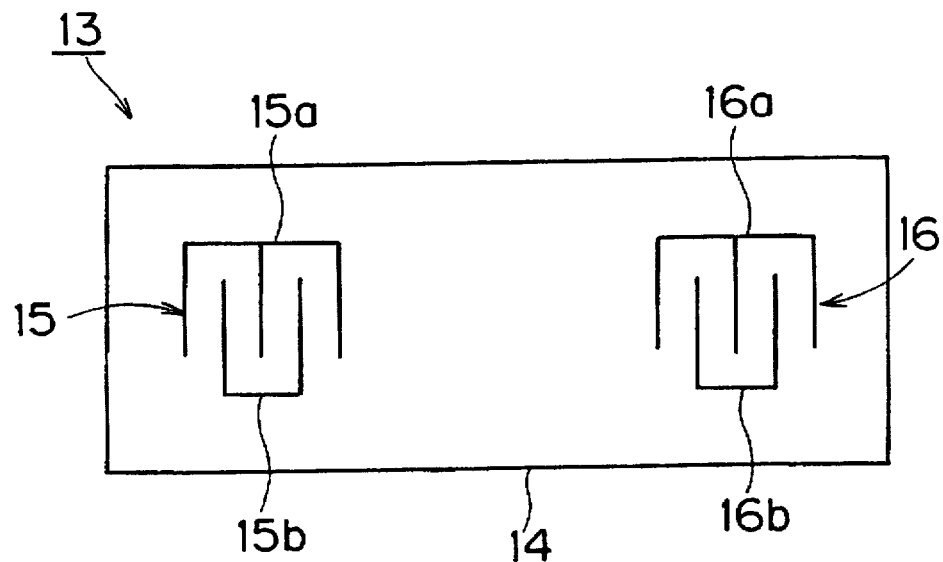
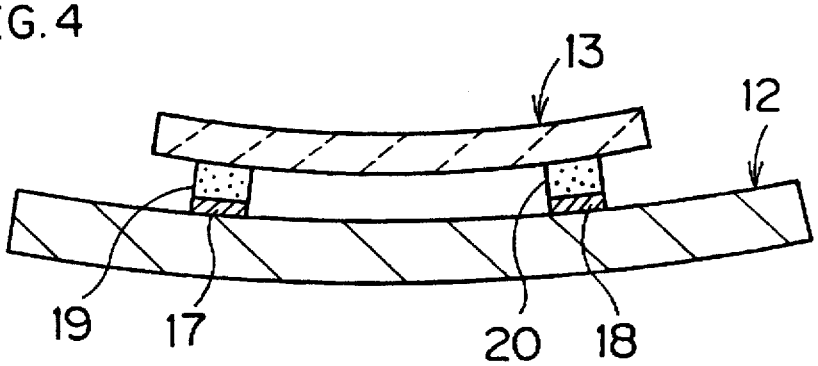
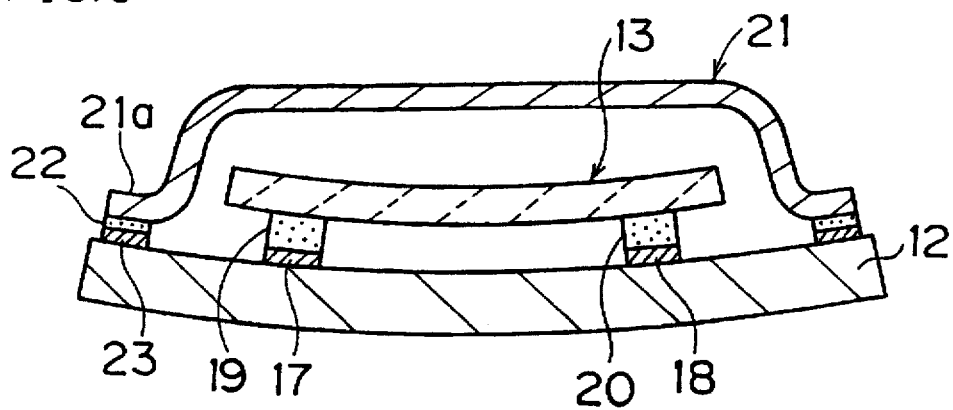

SURFACE ACOUSTIC WAVE DEVICE

BACKGROUND OF THE INVENTION

1. Field of the Invention

The present invention relates to a surface acoustic wave device which is improved in package structure, and more particularly, it relates to an improvement in a surface acoustic wave device comprising a package which is formed by a support substrate and a conductive cap, and a surface acoustic wave element which is mounted on the support substrate in the package in a face down mode.

2. Description of the Background Art

Known package structures for surface acoustic wave (hereinafter referred to as SAW) elements are (1) that formed by connecting a SAW element with metal terminals and covering the same with protective resin, (2) that formed by enclosing a SAW element with a package consisting of a support substrate and a metal cap, and (3) that formed by sealing a SAW element in a ceramic package.

FIG. 1 is a sectional view showing an example of a conventional SAW device, having a package structure which is formed by a support substrate and a metal cap. A SAW device 1 has a support substrate 2 which is made of insulating ceramics such as alumina. Electrode lands 4 and 5 are formed on an upper surface of the support substrate 2, for fixing a SAW element 3 and to be electrically connected with the same.

The SAW element 3 is mounted on the support substrate 2 in a face down mode. Namely, the SAW element 3 is so arranged as to downwardly direct its surface propagating surface waves. Terminal electrodes (not shown) of the SAW element 3 are bonded to the electrode lands 4 and 5 by solder members 6 and 7 respectively, thereby electrically connecting the SAW element 3 to the electrode lands 4 and 5.

On the other hand, a metal cap 8 is fixed to the support substrate 2, in order to enclose and seal the SAW element 3. This metal cap 8 has a downwardly opening shape, and is provided on its lower end with flange portions 8a extending substantially in parallel with the support substrate 2. The flange portions 8a are bonded to the support substrate 2 by solder members 9. The support substrate 2 is provided with metal pads 10, to be bonded with the solder members 9.

In the SAW device 1, the SAW element 1 is fixed onto the support substrate 2 in the face down mode through the solder members 6 and 7, whereby a space A is defined under the surface wave propagation surface of the SAW element 3 to allow vibration of the SAW element 3 upon driving. Namely, desired characteristics can be attained due to the space A which is defined by the thicknesses of the solder members 6 and 7. Further, the SAW element 3 is enclosed in a space which is formed by the support substrate 2 and the metal cap 8, whereby the characteristics are hardly deteriorated by oxidation of the electrode material forming the SAW element 3 and infiltration of moisture and gas from the exterior.

In the SAW device 1, the support substrate 2, the SAW element 3 and the metal cap 8 are expanded or contracted by ambient temperature change. When stress is applied to the SAW element 3 by such expansion or contraction, its characteristics are changed. In general, therefore, materials for the support substrate 2, the SAW element 3 and the metal cap 8 are so selected that the thermal expansion coefficients thereof are as equal as possible to each other.

However, it is almost impossible to equalize the thermal expansion coefficients of the support substrate 2, the SAW element 3 and the metal cap 8 to each other. Therefore, the support substrate 2, the SAW element 3 and the metal cap 8 are made of materials having closest possible thermal expansion coefficients. When the SAW device 1 is subjected to a reliability test such as a heat cycle test, however, there arise such problems that (1) the resonance frequency and the center frequency apt to deviate from target values, and (2) bonding through the solder members 6 and 7 is released to cause disconnection.

SUMMARY OF THE INVENTION

Accordingly, an object of the present invention is to provide a SAW device having excellent reliability, which hardly causes frequency fluctuation and disconnection resulting from difference in thermal expansion coefficient between materials forming a SAW element and a package upon temperature change.

The present invention is directed to an improvement of a SAW device, which comprises a support substrate and a SAW element bonded onto the support substrate by solder in a face down mode with a package formed by the support substrate and a conductive cap, and has the following structure:

The SAW device according to the present invention comprises a support substrate, a SAW element which is soldered onto the support substrate to downwardly direct its surface wave propagation surface, and a conductive cap which is soldered to the support substrate to enclose the SAW element. Assuming that $\alpha_1$, $\alpha_2$ and $\alpha_3$ represent the thermal expansion coefficients of the SAW element, the support substrate and the conductive cap along the surface wave propagation direction respectively, the SAW element, the support substrate and the conductive cap are so formed as to satisfy $\alpha_3 \geq \alpha_1$ when $\alpha_1 > \alpha_2$, or to satisfy $\alpha_3 \leq \alpha_1$ when $\alpha_1 < \alpha_2$.

The inventors have studied the aforementioned problem caused by the difference between the thermal expansion coefficients of the SAW element and the package, to discover that frequency fluctuation and disconnection in the soldered portions remarkably appear particularly when stress along the surface wave propagation direction is applied to the SAW element and the soldered portions. They have therefore considered that the aforementioned problem can be solved by so structuring a SAW element and members forming a package that stress along a surface wave propagation direction is hardly applied to the SAW element upon temperature change, and proposed the present invention.

According to the present invention, therefore, the SAW element and the members forming the package are not approached in thermal expansion coefficient to each other but so structured as to satisfy the aforementioned specific relation assuming that $\alpha_1$, $\alpha_2$ and $\alpha_3$ represent the thermal expansion coefficients of the SAW element, the support substrate and the conductive cap along the surface wave propagation direction respectively.

When $\alpha_1 > \alpha_2$, the SAW element is expanded or contracted more the support substrate along the surface wave propagation direction. In this case, the support substrate applies stress to the SAW element to suppress its expansion or contraction. Therefore, the thermal expansion coefficients are set as $\alpha_3 \geq \alpha_1$, in order to reduce the stress which is applied from the support substrate to the SAW element. Namely, the conductive cap is expanded/contracted more than the support substrate to reduce the stress which is applied from the support substrate to the SAW element, thereby suppressing characteristic fluctuation of the SAW element and disconnection in the soldered portions between the SAW element and the support substrate.

When $\alpha_1 < \alpha_2$, on the other hand, the support substrate is expanded/contracted more than the SAW element following temperature change, contrarily to the above. Therefore, force following such expansion/contraction is applied from the support substrate to the SAW element. In this case, the SAW element is expanded/contracted more than the conductive cap since $\alpha_3 \leq \alpha_1$. Namely, the conductive cap is expanded/contracted less than the SAW element following temperature change. Consequently, the force following the expansion/contraction which is applied from the support substrate to the SAW element is suppressed by the low thermal expandability of the conductive cap. Therefore, frequency fluctuation of the SAW element and the disconnection in the soldered portions between the SAW element and the support substrate are suppressed also in this case.

In the inventive SAW device, as hereinabove described, the thermal expansion coefficients of the SAW element, the support substrate and the conductive cap along the surface propagation direction are set in the aforementioned specific relation, whereby the soldered portions can be effectively inhibited from disconnection when the same are cooled from a high temperature state in soldering. Also when the SAW device is subjected to a reliability test such as a heat cycle test or exposed to abrupt temperature change in actual employment, the soldered portions can be inhibited from disconnection while stress which is applied to the SAW element in the surface wave propagation direction is reduced, whereby the center frequency and the resonance frequency are hardly shifted.

According to the present invention, therefore, it is possible to reduce bad influences resulting from difference in thermal expansion coefficient between the SAW element and the package structure, thereby providing a SAW device which is excellent in reliability against temperature change.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view showing a SAW element;

FIG. 4 is a sectional view for illustrating deformation following cooling of a structure comprising a support substrate and a SAW element mounted thereon;

FIG. 5 is a sectional view for illustrating stress which is applied following cooling in the embodiment.

DESCRIPTION OF THE PREFERRED EMBODIMENTS

An embodiment of the present invention is now described with reference to the drawings, to clarify the present invention.

Figure 1:
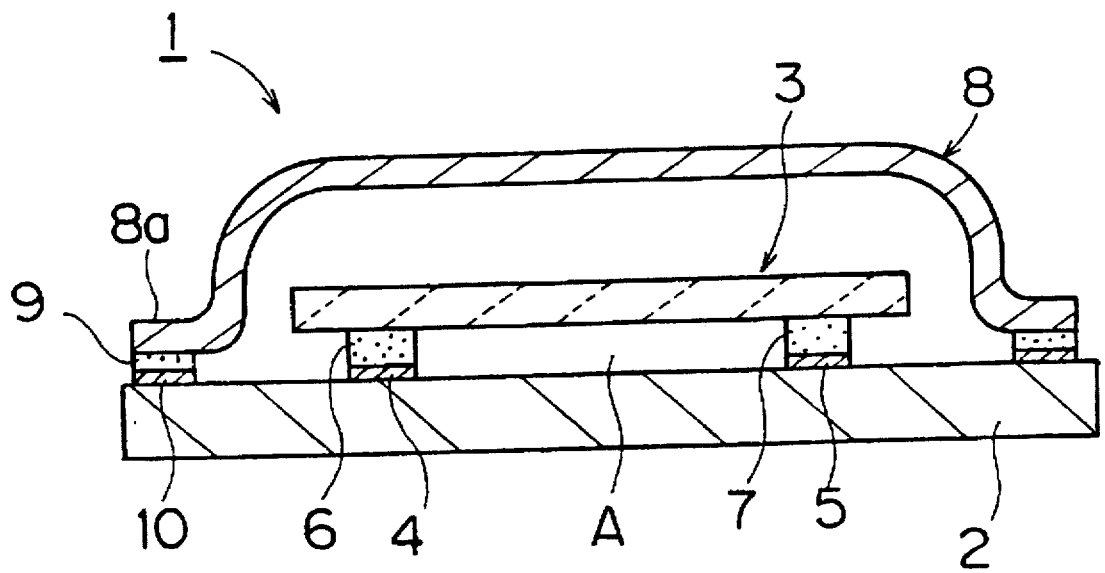
FIG. 1 is a sectional view showing an example of a conventional SAW device.
Figure 2:
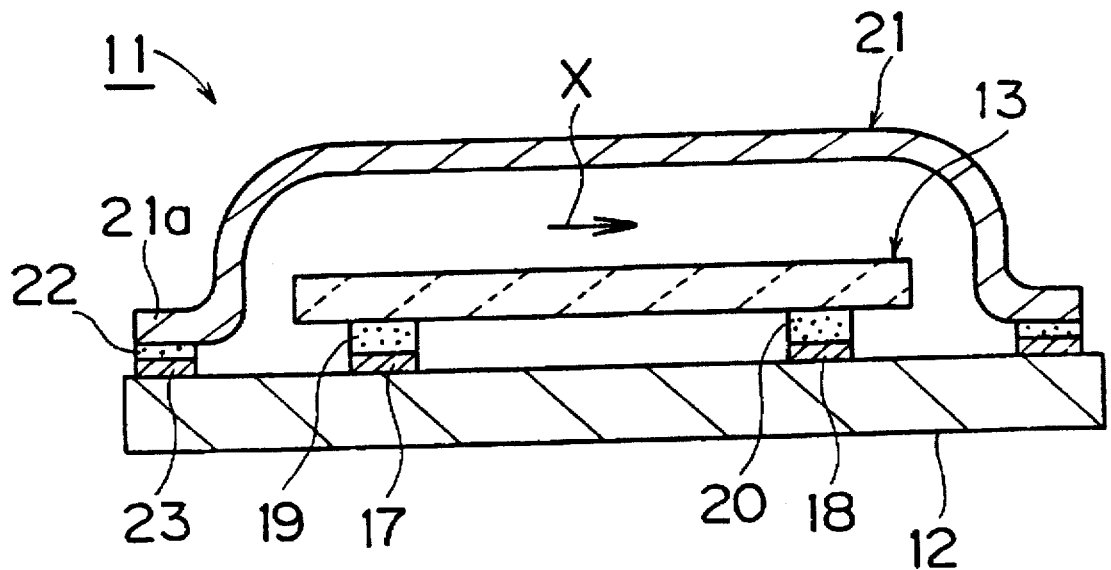
FIG. 2 is a sectional view showing a SAW device according to an embodiment of the present invention.
Figure 6:
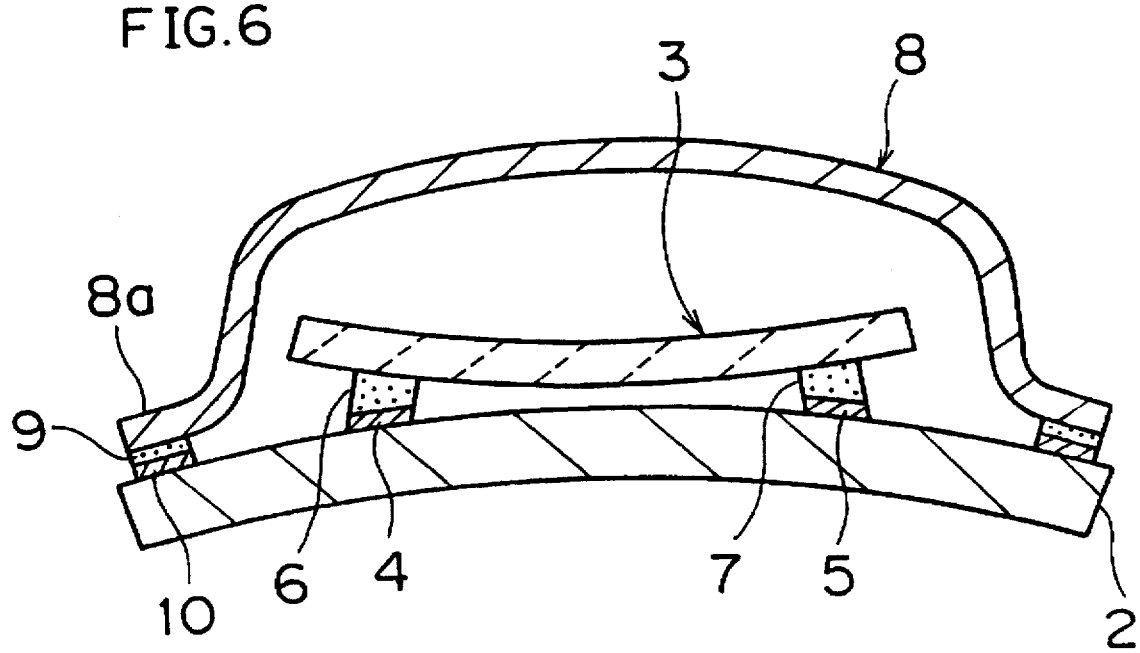
FIG. 6 is a sectional view for illustrating stress which is applied following cooling in a conventional SAW device.

FIG. 2 is a sectional view showing a SAW device 11 according to the embodiment of the present invention. The SAW device 11 has a support substrate 12 which is made of insulating ceramics such as alumina. Alternatively, the support substrate 12 may be made of another material such as a member prepared by coating a metal surface with an insulating film, or synthetic resin, in place of the insulating ceramics such as alumina, so far as the material satisfies the relation between thermal expansion coefficients described later.

A SAW element 13 is mounted on the support substrate 12 in a face down mode. The SAW element 13 can be formed by any SAW element such as a surface wave resonator, a surface wave filter or a surface wave delay line. FIG. 3 shows an exemplary SAW element 13. The SAW element 13 shown in FIG. 3 is a transversal SAW filter, which comprises a surface wave substrate 14 and a pair of interdigital transducers (hereinafter referred to as IDTs) 15 and 16 formed on one major surface thereof. The IDTs 15 and 16 are formed by pairs of comb electrodes 15a, 15b, 16a and 16b respectively. The pairs of comb electrodes 15a, 15b, 16a and 16b are so formed that electrode fingers thereof are interdigitated with each other respectively. The surface provided with the IDTs 15 and 16 is adapted to propagate surface waves.

The SAW element 13 is so mounted on the support substrate 12 as to downwardly direct the surface propagating surface waves. Namely, electrode lands 17 and 18 which are provided on the support substrate 12 are bonded to terminal electrodes (not shown) of the SAW element 13 by solder members 19 and 20 respectively. The terminal electrodes are connected to proper ones of the comb electrodes 15a, 15b, 16a and 16b of the IDTs 15 and 16 shown in FIG. 3, to serve as external connection electrodes for driving the SAW element 13.

In the SAW device 11, therefore, surface waves are propagated along arrow X in FIG. 2.

Further, a metal cap 21 is mounted on the support substrate 12, in order to enclose and seal the SAW element 3. The metal cap 21 has a downwardly opening shape, and is provided with flange portions 21a around its lower end. The flange portions 21a outwardly extend substantially in parallel with the support substrate 12, to be bonded to metal pads 23 which are formed on the support substrate 12 by solder members 22.

The metal cap 21, which is made of a proper metal material such as covar or german silver, is adapted to enclose and seal the SAW element 13, as well as to electromagnetically shield the SAW element 13. Therefore, the metal cap 21 may be replaced by a cap consisting of a material which is prepared by forming a conductive film on a surface of an insulating material, so far as the relation between thermal expansion coefficients described later is satisfied.

The feature of the SAW device 11 according to this embodiment resides in that the SAW element 13, the support substrate 12 and the metal cap 21 are so formed as to satisfy the following relation:

$$\alpha_3 > \alpha_1 > \alpha_2 \tag{1}$$

assuming that $\alpha_1$, $\alpha_2$ and $\alpha_3$ represent the thermal expansion coefficients of the SAW element 13, the support substrate 12 and the metal cap 21 along the direction X respectively. Such a structure is implemented by preparing the support substrate 12, the SAW element 13 and the metal cap 21 from alumina, a crystal substrate and Fe respectively, for example.

The SAW device 11 according to this embodiment, which is so structured as to satisfy the above expression (1), maintains the shape shown in FIG. 2 when the support substrate 12, the SAW element 13 and the metal cap 21 are bonded with each other by the solder members 19, 20 and 22, i.e., in a high temperature state. Thereafter the SAW device 11 is cooled from the soldering temperature to the ambient temperature (ordinary temperature), whereby the support substrate 12, the SAW element 13 and the metal cap 21 are cooled. With reference to this case, an effect of the SAW device 11 according to this embodiment is described in comparison with a conventional SAW device 1 prepared for the purpose of comparison.

In the comparative SAW device 1, a SAW element 3, a support substrate 12 and a metal cap 8 are prepared from a crystal substrate, alumina and a 42Ni alloy respectively, to satisfy the following relation:

$$\alpha_1 > \alpha_2 > \alpha_3 \quad (2)$$

assuming that $\alpha_1$, $\alpha_2$ and $\alpha_3$ represent the thermal expansion coefficients of the SAW element 3, the support substrate 2 and the metal cap 8 along a surface wave propagation direction respectively.

It is assumed here that the comparative and inventive SAW devices 1 and 11 are cooled from a high temperature atmosphere for soldering to the ordinary temperature.

It is also assumed that the SAW device 11 is provided with no metal cap 21, for example. In this case, the support substrate 12 and the SAW element 13 are contracted following the cooling, and deflected to upwardly direct both end portions, as shown in FIG. 4. Consequently, the SAW element 13 is contracted more than the support substrate 12 since $\alpha_1 > \alpha_2$, and tensile stress is applied from the support substrate 12 to the SAW element 13, to suppress the contraction of the SAW element 13.

In the actual SAW device 11, however, the metal cap 21 is contracted more than the support substrate 12 since $\alpha_3 > \alpha_1$. Namely, the tensile stress which is applied from the support substrate 12 to the SAW element 13 is relieved, as shown in FIG. 5. Consequently, the deflection caused by the tensile stress which is applied from the support substrate 12 to the SAW element 13 as well as stress applied to the solder members 19 and 20 are reduced.

When the conventional SAW device 1 is provided with no metal cap 8, on the other hand, tensile stress is applied to the SAW element 3 from the support substrate 2 due to the difference in thermal expansion coefficient between the same, similarly to the SAW device 11 according to this embodiment. Further, $\alpha_2 > \alpha_3$, i.e., the metal cap 8 is contracted less than the support substrate 2, and hence tensile stress is still applied from the support substrate 2 to the SAW element 3. In addition, the support substrate 2 also receives tensile stress from the metal cap 8. Thus, remarkable tensile stress is applied to the SAW element 3 while large stress is applied also to the portions bonded by the solder members 6 and 7.

In the SAW device 11 according to this embodiment, the respective members are formed to satisfy the above expression (1), whereby distortion which is applied to the SAW element 13 along the surface wave propagation direction is so relieved that frequency fluctuation can be suppressed, while the stress applied to the portions bonded by the solder members 19 and 20 is also reduced to hardly cause disconnection etc.

The above embodiment has been described with reference to the case of satisfying the above expression (1) when $\alpha_1 > \alpha_2$, i.e., the case of $\alpha_3 \geq \alpha_1$. When $\alpha_1 < \alpha_2$, on the other hand, it is possible to relieve tensile stress which is applied from the support substrate 12 to the SAW element 13 by temperature change by inverting the relation to $\alpha_3 \leq \alpha_1$.

While the above embodiment has been described with reference to the case of cooling the SAW device 13 from a high temperature in soldering to the ordinary temperature, it is understood that stress applied from the support substrate 12 to the SAW element 13 as well as to the bonded portions can be relieved also when temperature change is applied in actual employment, by setting the thermal expansion coefficients of the support substrate 12, the SAW element 13 and the metal cap 21 along the surface wave propagation direction in the aforementioned specific relation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device comprising:

a support substrate;

a surface acoustic wave element being soldered onto said support substrate to downwardly direct its surface wave propagation surface; and a conductive cap being soldered to said support substrate for enclosing said surface acoustic wave element, said surface acoustic wave element, said support substrate and said conductive cap being so formed as to satisfy $\alpha_3 \geq \alpha_1$ when $\alpha_1 > \alpha_2$, or to satisfy $\alpha_3 \leq \alpha_1$ when $\alpha_1 < \alpha_2$ assuming that $\alpha_1$, $\alpha_2$ and $\alpha_3$ represent thermal expansion coefficients of said surface acoustic wave element, said support substrate and said conductive cap along the surface wave propagation direction respectively.

2. The surface acoustic wave device in accordance with claim 1, wherein said surface acoustic wave element has a surface substrate, at least one interdigital transducer being formed on one major surface of said surface substrate, and a terminal electrode being formed to be electrically connected with said interdigital transducer, said major surface being formed with said interdigital transducer defining said surface wave propagation surface.

3. The surface acoustic wave device in accordance with claim 2, further comprising an electrode land being formed on said support substrate, said electrode land being bonded to said terminal electrode of said surface acoustic wave element by soldering.

4. The surface acoustic wave device in accordance with claim 1, wherein said conductive cap is formed by a metal cap.

5. The surface acoustic wave device in accordance with claim 4, wherein said thermal expansion coefficients $\alpha_1$, $\alpha_2$ and $\alpha_3$ are in relation of $\alpha_3 > \alpha_1 > \alpha_2$, said support substrate is formed by an alumina substrate, said surface acoustic wave element is formed by a crystal substrate, and said metal cap consists of iron.

* * * * *

UNITED STATES PATENT AND TRADEMARK OFFICE
CERTIFICATE OF CORRECTION

PATENT NO. : 5,712,523
DATED : January 27, 1998
INVENTOR(S) : Koji NAKASHIMA et al.

It is certified that error appears in the above-identified patent and that said Letters Patent is hereby corrected as shown below:

On the title page, at [30] Foreign Application Priority Data, change "7-002829" to --7-002839--.

Signed and Sealed this

Fifteenth Day of December, 1998

Attest:

BRUCE LEHMAN

*Attesting Officer*   *Commissioner of Patents and Trademarks*